US009657143B2

(12) United States Patent
Kim et al.

(10) Patent No.: US 9,657,143 B2
(45) Date of Patent: May 23, 2017

(54) CURABLE POLYSILOXANE COMPOSITION FOR OPTICAL DEVICE AND ENCAPSULANT AND OPTICAL DEVICE

(71) Applicant: CHEIL INDUSTRIES INC., Gumi-si, Gyeongsangbuk-do (KR)

(72) Inventors: Young-Ho Kim, Suwon-si (KR); Sang-Ran Koh, Suwon-si (KR); Woo-Han Kim, Suwon-si (KR); Hong-Jung Yoo, Suwon-si (KR); Eun-Seon Lee, Suwon-si (KR); Ha-Neul Kim, Suwon-si (KR); Yun-Hee Baek, Suwon-si (KR); Doo-Ri Song, Suwon-si (KR); Dong-Ju Shin, Suwon-si (KR); Chi-Won An, Suwon-si (KR)

(73) Assignee: Cheil Industries, Inc., Gumi-Si, Gyeongsangbuk-do (KR)

( * ) Notice: Subject to any disclaimer, the term of this patent is extended or adjusted under 35 U.S.C. 154(b) by 0 days.

(21) Appl. No.: 14/653,328

(22) PCT Filed: Dec. 24, 2013

(86) PCT No.: PCT/KR2013/012122
§ 371 (c)(1),
(2) Date: Jun. 18, 2015

(87) PCT Pub. No.: WO2014/104719
PCT Pub. Date: Jul. 3, 2014

(65) Prior Publication Data
US 2015/0353688 A1  Dec. 10, 2015

(30) Foreign Application Priority Data
Dec. 26, 2012 (KR) .................. 10-2012-0153567
Oct. 25, 2013 (KR) .................. 10-2013-0127975

(51) Int. Cl.
*C08G 77/18* (2006.01)
*C09D 183/06* (2006.01)
(Continued)

(52) U.S. Cl.
CPC .............. *C08G 77/18* (2013.01); *C08L 83/04* (2013.01); *C09D 183/06* (2013.01); *C08G 77/12* (2013.01);
(Continued)

(58) Field of Classification Search
None
See application file for complete search history.

(56) References Cited

U.S. PATENT DOCUMENTS 4,912,188 A * 3/1990 Colas ...................... C08L 83/04
525/476
5,994,454 A * 11/1999 Chung ................ B32B 17/1055
522/148
(Continued)

FOREIGN PATENT DOCUMENTS

CN 102558872 A 7/2012
CN 102725356 A 10/2012
(Continued)

OTHER PUBLICATIONS

Search Report dated Jan. 19, 2015 in corresponding Taiwanese Patent Application No. 102148244.
(Continued)

Primary Examiner — Robert S Loewe
(74) Attorney, Agent, or Firm — Lee & Morse, P.C.

(57) ABSTRACT

Disclosed are a curable polysiloxane composition for an optical device includes at least one of a first siloxane compound represented by the following Chemical Formula 1, at least one of a second siloxane compound having silicon-bonded hydrogen (Si—H) at the terminal end, and at
(Continued)

least one of a third siloxane compound having a silicon-bonded alkenyl group (Si-Vi) at the terminal end, an encapsulant obtained by curing the curable polysiloxane composition for an optical device, and an optical device including the encapsulant.

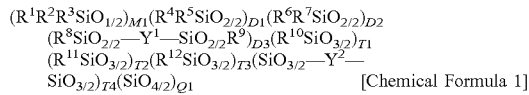

[Chemical Formula 1]

In the above Chemical Formula 1, $R^1$ to $R^{12}$, $Y^1$, $Y^2$, M1, D1, D2, D3, T1, T2, T3, T4 and Q1 are the same as defined in the specification.

9 Claims, 1 Drawing Sheet

(51) Int. Cl.
*C08L 83/04* (2006.01)
*H01L 33/56* (2010.01)
*C08K 5/5425* (2006.01)
*C08G 77/12* (2006.01)
*C08G 77/20* (2006.01)
*C08G 77/46* (2006.01)

(52) U.S. Cl.
CPC .............. *C08G 77/20* (2013.01); *C08G 77/46* (2013.01); *C08K 5/5425* (2013.01); *H01L 33/56* (2013.01)

(56) References Cited

U.S. PATENT DOCUMENTS

| | | | | |
|---|---|---|---|---|
| 6,103,847 A * | 8/2000 | Lewis | ............ | C08G 77/10 528/18 |
| 6,599,974 B1 * | 7/2003 | Bublewitz | ............ | A61C 9/0006 106/38.2 |
| 6,630,415 B2 * | 10/2003 | Phillips | ............ | C07F 7/0852 428/445 |
| 7,572,842 B2 * | 8/2009 | Zech | ............ | A61K 6/10 523/109 |
| 2004/0069973 A1 * | 4/2004 | Keohan | ............ | C08L 83/12 252/500 |
| 2005/0075468 A1 * | 4/2005 | Knott | ............ | C08G 77/38 528/15 |
| 2009/0234089 A1 * | 9/2009 | Ueyama | ............ | C08F 8/42 526/279 |
| 2010/0168325 A1 * | 7/2010 | Gough | ............ | C08G 77/46 524/588 |
| 2010/0249339 A1 * | 9/2010 | Henning | ............ | C08G 77/08 525/479 |

FOREIGN PATENT DOCUMENTS

| | | |
|---|---|---|
| JP | 2003-213134 A | 7/2003 |
| JP | 2006-213761 A | 8/2006 |
| JP | 2006-299099 A | 11/2006 |
| JP | 2006-299150 A | 11/2006 |
| JP | 2010-084118 A | 4/2010 |
| JP | 2010-202880 A | 9/2010 |
| JP | 2010-248413 A | 11/2010 |
| KR | 10-0980270 B1 | 8/2010 |
| KR | 10-1011329 B1 | 1/2011 |
| KR | 10-2011-0085214 A | 7/2011 |
| KR | 10-2011-0087243 A | 8/2011 |
| KR | 10-2011-0121151 A | 11/2011 |
| KR | 10-2012-0078599 A | 7/2012 |
| KR | 10-2012-0078606 A | 7/2012 |
| KR | 10-2012-0078614 A | 7/2012 |
| KR | 10-2012-0080141 A | 7/2012 |
| KR | 10-2012-0125194 A | 11/2012 |
| KR | 10-1204116 B1 | 11/2012 |
| TW | 201035245 A1 | 10/2010 |
| WO | WO 2012-093907 A2 | 7/2012 |
| WO | WO 2012-150850 A2 | 11/2012 |

OTHER PUBLICATIONS

Search Report dated Jun. 16, 2016 in corresponding Chinese Patent Application No. 201380067615.X. (Kim, et al.).

* cited by examiner

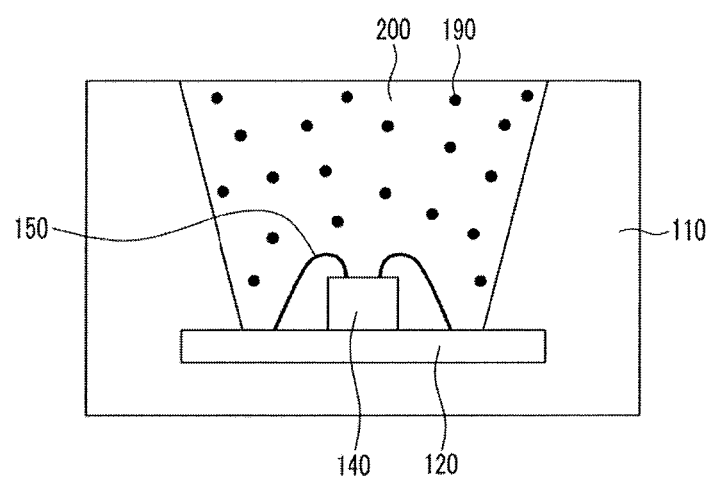

CURABLE POLYSILOXANE COMPOSITION FOR OPTICAL DEVICE AND ENCAPSULANT AND OPTICAL DEVICE

TECHNICAL FIELD

A curable polysiloxane composition for an optical device, and an encapsulant and optical device are disclosed.

BACKGROUND ART

An optical device such as a light emitting diode (LED), an organic light emitting device (OLED) device, and a photoluminescent (PL) device is applicable to various fields such as for electric home appliances, lighting devices, display devices, and automation devices.

These optical devices may include a sealing package such as an encapsulant to protect an optical device. This sealing package is made from a composition including a light transmittance resin, so that light emitted from the optical devices may be externally transmitted.

On the other hand, the sealing package may be applied to improve a process yield, and herein, the products should be present on a similar color coordinate. In addition, when the products are discolored by sulfur due to an environmental factor to which the sealing package is exposed, their luminance may be sharply deteriorated.

DISCLOSURE

Technical Problem

One embodiment provides a curable polysiloxane composition for an optical device capable of improving processability and reliability by increasing a degree of color scattering and sulfur resistance.

Another embodiment provides an encapsulant obtained by curing the curable polysiloxane composition for an optical device.

Another embodiment provides an optical device including the encapsulant.

Technical Solution

According to one embodiment, a curable polysiloxane composition for an optical device includes at least one of a first siloxane compound represented by the following Chemical Formula 1, at least one of a second siloxane compound having silicon-bonded hydrogen (Si—H) at the terminal end, and at least one of a third siloxane compound having a silicon-bonded alkenyl group (Si-Vi) at the terminal end.

$(R^1R^2R^3SiO_{1/2})_{M1}(R^4R^5SiO_{2/2})_{D1}(R^6R^7SiO_{2/2})_{D2}$
$(R^8SiO_{2/2}-Y^1-SiO_{2/2}R^9)_{D3}(R^{10}SiO_{3/2})_{T1}$
$(R^{11}SiO_{3/2})_{T2}(R^{12}SiO_{3/2})_{T3}(SiO_{3/2}-Y^2-$
$SiO_{3/2})_{T4}(SiO_{4/2})_{Q1}$     [Chemical Formula 1]

In the above Chemical Formula 1, $R^1$ to $R^{12}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, or a group represented by the following Chemical Formula 1a, at least one of $R^1$ to $R^{12}$ is a group represented by the following Chemical Formula 1a, $Y^1$ and $Y^2$ are independently a single bond, a substituted or unsubstituted C1 to C30 alkylene group, a substituted or unsubstituted C3 to C30 cycloalkylene group, unsubstituted C1 to C30 heteroalkylene group, a substituted or unsubstituted C6 to C30 arylene group, a substituted or unsubstituted C3 to C30 heteroarylene group, or a combination thereof, $0 \leq M1 < 1$, $0 \leq D1 < 1$, $0 \leq D2 < 1$, $0 \leq D3 < 1$, $0 \leq T1 < 1$, $0 \leq T2 < 1$, $0 \leq T3 < 1$, $0 \leq T4 < 1$ and $0 \leq Q1 < 1$, and $M1+D1+D2+D3+T1+T2+T3+T4+Q1=1$.

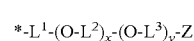
    [Chemical Formula 1a]

In the above Chemical Formula 1a, $L^1$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, $L^2$ and $L^3$ are independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, Z is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $0 \leq x \leq 200$ and $0 \leq y \leq 200$, x and y are not simultaneously 0, and

* is a point where silicon (Si) of Chemical Formula 1 is linked.

The first siloxane compound may be represented by the following Chemical Formula 2.

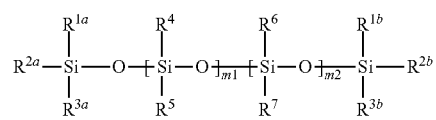
    [Chemical Formula 2]

In the above Chemical Formula 2, $R^{1a}$, $R^{2a}$, $R^{3a}$, $R^{1b}$, $R^{2b}$, $R^{3b}$ and $R^4$ to $R^7$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, or the group represented by the above Chemical Formula 1a, at least one of $R^{1a}$, $R^{2a}$, $R^{3a}$, $R^{1b}$, $R^{2b}$ and $R^{3b}$ is the group represented by the above Chemical Formula 1a, $0 \leq m_1 < 1000$, and $0 \leq m_2 < 1000$.

The first siloxane compound may be represented by the following Chemical Formula 3.

[Chemical Formula 3]

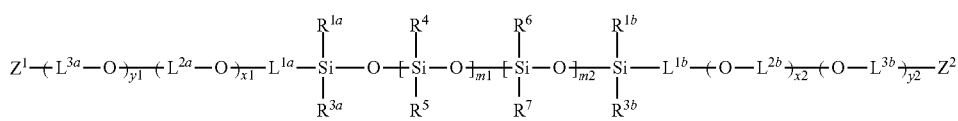

In the above Chemical Formula 3, $R^{1a}$, $R^{3a}$, $R^{1b}$, $R^{3b}$ and $R^4$ to $R^7$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $L^{1a}$ and $L^{1b}$ are independently a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, $L^{2a}$, $L^{2b}$, $L^{3a}$ and $L^{3b}$ are independently a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, $Z^1$ and $Z^2$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $0 \leq m_1 < 1000$, $0 \leq m_2 < 1000$, $0 \leq x1 \leq 200$, $0 \leq x2 < 200$, $0 \leq y1 < 200$ and $0 \leq y2 < 200$, x1 and y1 are not simultaneously 0, and x2 and y2 are not simultaneously 0.

The $L^{1a}$, $L^{1b}$, $L^{2a}$, $L^{2b}$, $L^{3a}$ and $L^{3b}$ may be independently a substituted or unsubstituted C1 to C5 alkylene group.

One of the $L^{2a}$ and $L^{3a}$ may be a substituted or unsubstituted ethylene group, the other may be a substituted or unsubstituted propylene group, and one of the $L^{2b}$ and $L^{3b}$ may be a substituted or unsubstituted ethylene group and the other may be a substituted or unsubstituted propylene group.

The first siloxane compound may be represented by the following Chemical Formula 4-1 or 4-2.

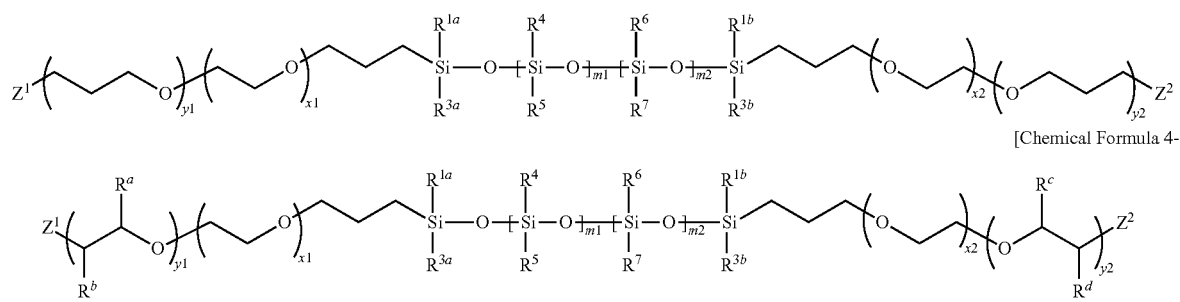

In the above Chemical Formula 4-1 or 4-2.

$R^{1a}$, $R^{1b}$, $R^{3a}$, $R^{3b}$, $R^4$ to $R^7$ and $R^a$ to $R^d$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $R^a$ or $R^b$ is a substituted or unsubstituted methyl group, $R^c$ or $R^d$ is a substituted or unsubstituted methyl group, $Z^1$ and $Z^2$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $0 \le m_1 < 1000$, $0 \le m_2 < 1000$, $0 \le x1 \le 200$, $0 \le x2 \le 200$, $0 \le y1 \le 200$ and $0 \le y2 \le 200$, x1 and y1 are not simultaneously 0, and x2 and y2 are not simultaneously 0.

At least two of the $R^{1a}$, $R^{1b}$, $R^{3a}$, $R^{3b}$, $R^4$ to $R^7$ may be a methyl group.

The group represented by the above Chemical Formula 1a may be a group represented by the following Chemical Formula 1aa.

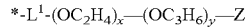   [Chemical Formula 1aa]

In the above Chemical Formula 1aa, $L^1$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, Z is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $0 \le x \le 200$ and $0 \le y \le 200$, x and y are not simultaneously 0, and

* is a point where silicon (Si) of Chemical Formula 1 is linked.

At least one of $R^1$ to $R^{12}$ and Z of the above Chemical Formula 1 may include hydrogen or a substituted or unsubstituted C2 to C30 alkenyl group.

The first siloxane compound may be represented by the following Chemical Formula 5.

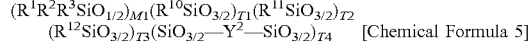   [Chemical Formula 5]

In the above Chemical Formula 5, $R^1$ to $R^3$, $R^{11}$ and $R^{12}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $R^{10}$ is the group represented by the above Chemical Formula 1aa, $Y^2$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, $0 \le M1 < 1$, $0 \le T1 < 1$, $0 \le T2 < 1$, $0 \le T3 < 1$ and $0 \le T4 < 1$, and $M1+T1+T2+T3+T4=1$.

The second siloxane compound may be represented by the following Chemical Formula 6.

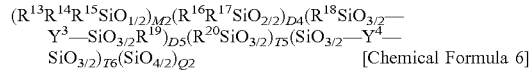   [Chemical Formula 6]

In the above Chemical Formula 6, $R^{13}$ to $R^{20}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{13}$ to $R^{20}$ includes hydrogen, $Y^3$ and $Y^4$ are independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C3 to C20 heteroarylene group, a substituted or unsubstituted C2 to C20 alkenylene group, a substituted or unsubstituted C2 to C20 alkynylene group, or a combination thereof, $0 \le M2 < 1$, $0 \le D4 < 1$, $0 \le D5 < 1$, $O \le T5 < 1$, $0 \le T6 < 1$, $0 \le Q2 < 1$, and $M2+D4+D5+T5+T6+Q2=1$.

The third siloxane compound may be represented by the following Chemical Formula 7.

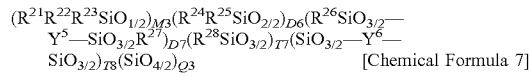   [Chemical Formula 7]

In the above Chemical Formula 7, $R^{21}$ to $R^{28}$ are independently substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{21}$ to $R^{28}$ includes a substituted or unsubstituted C2 to C30 alkenyl group, $Y^5$ and $Y^6$ are independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, 0≤M3<1, 0≤D6<1, 0≤D7<1, 0≤T7<1, 0≤T8<1, 0≤Q3<1, and

M3+D6+D7+T7+T8+Q3=1.

The second siloxane compound may be included in an amount of less than about 50 parts by weight based on 100 parts by weight of the second siloxane compound and the third siloxane compound, and the third siloxane compound may be included in an amount of greater than about 50 parts by weight based on 100 parts by weight of the second siloxane compound and the third siloxane compound.

The first siloxane compound may be included in an amount of about 0.01 to 20 wt % based on the total amount of the composition.

According to another embodiment, an encapsulant obtained by curing the curable polysiloxane composition for an optical device is provided.

According to another embodiment, an optical device including the encapsulant is provided.

Advantageous Effects

Characteristics such as refraction index, hardness, transmittance, heat resistance, and the like are not affected and a degree of color scattering and sulfur resistance is increased and thus, processability and reliability may be improved.

DESCRIPTION OF DRAWINGS

FIG. 1 is a cross-sectional view of a light emitting diode according to one embodiment.

BEST MODE

Exemplary embodiments of the present invention will hereinafter be described in detail, and may be easily performed by those who have common knowledge in the related art. However, this disclosure may be embodied in many different forms and is not construed as limited to the exemplary embodiments set forth herein.

As used herein, when a definition is not otherwise provided, the term 'substituted' refers to one substituted with a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound.

As used herein, when a definition is not otherwise provided, the term 'hetero' refers to one including at least one hetero atom selected from N, O, S and P.

Hereinafter, a curable polysiloxane composition for an optical device according to one embodiment is described.

A curable polysiloxane composition for an optical device (hereinafter, referred to be 'composition') according to one embodiment includes at least one of a first siloxane compound represented by the following Chemical Formula 1, at least one of a second siloxane compound having silicon-bonded hydrogen (Si—H) at the terminal end and at least one of a third siloxane compound having a silicon-bonded alkenyl group (Si-Vi) at the terminal end.

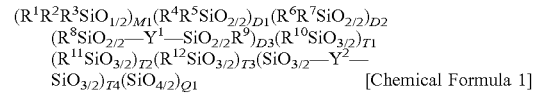

$(R^1R^2R^3SiO_{1/2})_{M1}(R^4R^5SiO_{2/2})_{D1}(R^6R^7SiO_{2/2})_{D2}$
$(R^8SiO_{2/2}{-}Y^1{-}SiO_{2/2}R^9)_{D3}(R^{10}SiO_{3/2})_{T1}$
$(R^{11}SiO_{3/2})_{T2}(R^{12}SiO_{3/2})_{T3}(SiO_{3/2}{-}Y^2{-}$
$SiO_{3/2})_{T4}(SiO_{4/2})_{Q1}$      [Chemical Formula 1]

In the above Chemical Formula 1, $R^1$ to $R^{12}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, or a group represented by the following Chemical Formula 1a, at least one of $R^1$ to $R^{12}$ is a group represented by the following Chemical Formula 1a, $Y^1$ and $Y^2$ are independently a single bond, a substituted or unsubstituted C1 to C30 alkylene group, a substituted or unsubstituted C3 to C30 cycloalkylene group, unsubstituted C1 to C30 heteroalkylene group, a substituted or unsubstituted C6 to C30 arylene group, a substituted or unsubstituted C3 to C30 heteroarylene group, substituted, or a combination thereof, 0≤M1<1, 0≤D1<1, 0≤D2<1, 0D≤D3<1, 0≤T1<1, 0≤T2<1, 0≤T3<1, 0≤T4<1 and 0≤Q1<1, and

M1+D1+D2+D3+T1+T2+T3+T4+Q1=1.

$*{-}L^1{-}(O{-}L^2)_x{-}(O{-}L^3)_y{-}Z$      [Chemical Formula 1a]

In the above Chemical Formula 1a, $L^1$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, $L^2$ and $L^3$ are independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, Z is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, 0≤x≤200 and 0≤y≤200, x and y are not simultaneously 0, and

* is a point where silicon (Si) of Chemical Formula 1 is linked.

The first siloxane compound is included as one kind of additive and thus, may increase surface tension and surface flatness and improve a surface coating effect during curing of the composition. In addition, the first siloxane compound has a hydrophilic group represented by the above Chemical Formula 1a and thus, may increase dispersion of a phosphor in the composition. Accordingly, an encapsulant obtained by curing the composition may effectively prevent permeation of an exterior contamination material such as sulfur and thus, improve reliability and simultaneously, make a phosphor uniformly dispersed therein and thus, increase a degree of color scattering.

In addition, the first siloxane compound has a siloxane structure which increases structural affinity for a second siloxane compound having silicon-bonded hydrogen (Si—H) and a third siloxane compound having a silicon-bonded alkenyl group (Si-Vi), and thus, may prevent phase-separation of an additive in the composition.

The first siloxane compound may be, for example, represented by the following Chemical Formula 2.

[Chemical Formula 2]

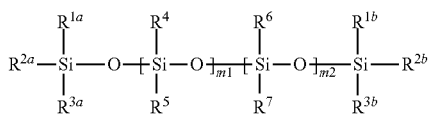

In the above Chemical Formula 2, $R^{1a}$, $R^{2a}$, $R^{3a}$, $R^{1b}$, $R^{2b}$, $R^{3b}$ and $R^4$ to $R^7$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, or the group represented by the above Chemical Formula 1a, at least one of $R^{1a}$, $R^{2a}$, $R^{3a}$, $R^{1b}$, $R^{2b}$ and $R^{3b}$ is the group represented by the above Chemical Formula 1a, and $0 \leq m_{1<1000}$, and $0 \leq m_{2<1000}$.

The first siloxane compound may be, for example, represented by the following Chemical Formula 3.

substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $L^{1a}$ and $L^{1b}$ are independently a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, $L^{2a}$, $L^{2b}$, $L^{3a}$ and $L^{3b}$ are independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, $Z^1$ and $Z^2$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $0 \leq m_1 < 1000$, $0 \leq m_2 < 1000$, $0 \leq x1 \leq 200$, $0 \leq x2 \leq 200$, $0 \leq y1 \leq 200$ and $0 \leq y2 \leq 200$, x1 and y1 are not simultaneously 0, and x2 and y2 are not simultaneously 0.

For example, in the above Chemical Formula 3, the $L^{1a}$, $L^{1b}$, $L^{2a}$, $L^{2b}$, $L^{3a}$ and $L^{3b}$ may be independently a substituted or unsubstituted C1 to C5 alkylene group. For example the $L^{1a}$ and $L^{1b}$ may be independently a substituted or unsubstituted propylene group. For example, one of the $L^{2a}$ and $L^{3a}$ may be a substituted or unsubstituted ethylene group, and the other may be a substituted or unsubstituted propylene group. For example, one of the $L^{2b}$ and $L^{3b}$ may be a substituted or unsubstituted ethylene group and the other may be a substituted or unsubstituted propylene group.

[Chemical Formula 3]

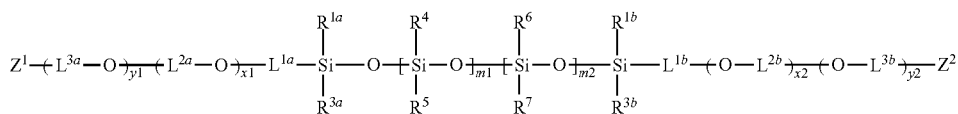

In the above Chemical Formula 3, $R^{1a}$, $R^{3a}$, $R^{1b}$, $R^3$ and $R^4$ to $R^7$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a For example, in the above Chemical Formula 3, the $Z^1$ and $Z^2$ may be independently a substituted or unsubstituted C1 to C30 alkoxy group or a hydroxy group.

The first siloxane compound may be, for example, represented by the following Chemical Formula 4-1 or Chemical Formula 4-2.

[Chemical Formula 4-1]

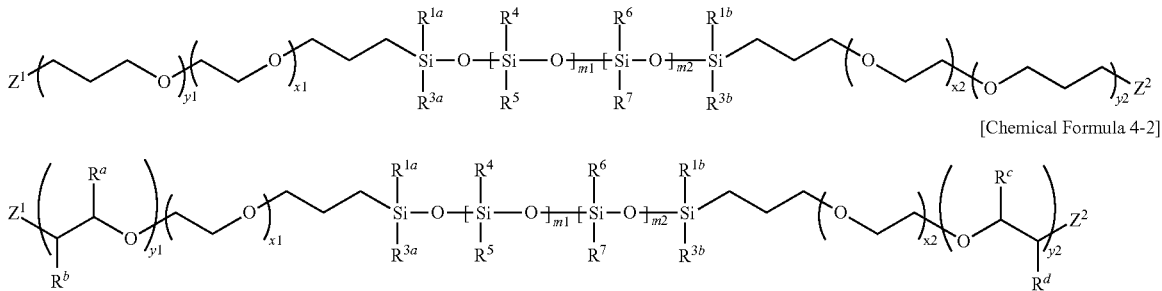

[Chemical Formula 4-2]

In the above Chemical Formula 4-1 or 4-2, $R^{1a}$, $R^{1b}$, $R^{3a}$, $R^{3b}$, $R^4$ to $R^7$, $Z^1$, $Z^2$, $Z^2$, $m_1$, $m_2$, X1, x2, y1 and y2 are the same as described above, $R^a$ to $R^d$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $R^a$ or $R^b$ is a substituted or unsubstituted methyl group, and $R^c$ or $R^d$ is a substituted or unsubstituted methyl group.

For example, in the above Chemical Formula 4, the $Z^1$ and $Z^2$ may be independently a substituted or unsubstituted C1 to C30 alkoxy group or a hydroxy group.

For example, in the above Chemical Formula 4, at least two of $R^{1a}$, $R^{1b}$, $R^{3a}$, $R^{3b}$, $R^4$ to $R^7$ may be a methyl group, or at least four may be a methyl group.

In the above Chemical Formula 1, the group represented by the above Chemical Formula 1a may be, for example a group represented by the following Chemical Formula 1a.

*-L$^1$-(OC$_2$H$_4$)$_x$—(OC$_3$H$_6$)$_y$—Z    [Chemical Formula 1aa]

In the above Chemical Formula 1aa, $L^1$, Z, x and y are the same as described above.

The group represented by the above Chemical Formula 1aa includes ethylene oxide and/or propylene and may increase oxide surface tension and surface flatness as described above and thus, improve surface coating effects of an encapsulant and effectively prevent permeation of an exterior contamination material and thus, improve reliability and simultaneously, uniformly make a phosphor dispersed inside the encapsulant due to hydrophilicity and increase a degree of color scattering.

For example, in the above Chemical Formula 1aa, the $L^1$ may be a substituted or unsubstituted C1 to C5 alkylene group, for example a substituted or unsubstituted propylene group.

When the first siloxane compound includes the group represented by the above Chemical Formula 1aa, the terminal end of the first siloxane compound, that is, at least one of the $R^1$ to $R^{12}$ and Z may include hydrogen or a substituted or unsubstituted C2 to C30 alkenyl group. The first siloxane compound includes hydrogen or a substituted or unsubstituted C2 to C30 alkenyl group at the terminal end and participates in a hydrosilylation reaction with the post-described second or third siloxane compound and thus, may improve physical characteristics of an encapsulant.

The first siloxane compound may be, for example, represented by the following Chemical Formula 5.

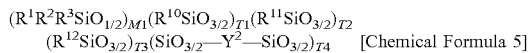
$(R^{12}SiO_{3/2})_{T3}(SiO_{3/2}-Y^2-SiO_{3/2})_{T4}$    [Chemical Formula 5]

In the above Chemical Formula 5, $R^1$ to $R^3$, $R^{11}$ and $R^{12}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $R^{10}$ is the group represented by the above Chemical Formula 1aa, $Y^2$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, $0 \leq M1 < 1$, $0 \leq T1 < 1$, $0 \leq T2 < 1$, $0 \leq T3 < 1$ and $0 \leq T4 < 1$, and $M1+T1+T2+T3+T4=1$.

The first siloxane compound may be obtained, for example, through hydrolysis and/or condensation polymerization of a silane monomer.

For example, the first siloxane compound represented by the above Chemical Formula 1 may be obtained, for example, through hydrolysis and condensation polymerization of a monomer represented by $R^1R^2R^3SiA^1$, a monomer represented by $R^4R^5SiA^2A^3$, a monomer represented by $R^6R^7SiA^4A^5$, a monomer represented by $A^6A^7R^8Si-Y^1-SiR^9A^8A^9$, a monomer represented by $R^{10}SiA^{10}A^{11}A^{12}$, a monomer represented by $R^{11}SiA^{13}A^{14}A^{15}$, a monomer represented by $R^{12}SiA^{16}A^{17}A^{18}$, a monomer represented by $A^{19}A^{20}A^{21}Si-Y^2-SiA^{22}A^{23}A^{24}$, and a monomer represented by $SiA^{25}A^{26}A^{27}A^{28}$. Herein, $R^1$ to $R^{12}$, $Y^1$ and $Y^2$ are the same as defined above, and $A^1$ to $A^{28}$ are independently C1 to C6 alkoxy group, a hydroxy group, a halogen, a carboxyl group, or a combination thereof.

The first siloxane compound may be used as one or a mixture of two or more.

The first siloxane compound may be included in an amount of about 0.01 to 20 wt % based on the total of the composition. When the first siloxane compound is included within the range, the first siloxane compound may have no influence on physical characteristics of an encapsulant such as a refractive index, hardness, transmittance, heat resistance, and the like but effectively improve a degree of color scattering and sulfur resistance. Specifically, the first siloxane compound may be included in an amount of about 0.1 to 10 wt %, more specifically, about 0.1 to 5 wt %, and much more specifically, about 0.1 to 1 wt % within the range.

The second siloxane compound may be represented by the following Chemical Formula 6.

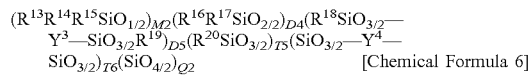

[Chemical Formula 6]

In the above Chemical Formula 6, $R^{13}$ to $R^{20}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{13}$ to $R^{20}$ includes hydrogen, $Y^3$ and $Y^4$ are independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C3 to C20 heteroarylene group, a substituted or unsubstituted C2 to C20 alkenylene group, a substituted or unsubstituted C2 to C20 alkynylene group, or a combination thereof, $0 \leq M2 < 1$, $0 \leq D4 < 1$, $0 \leq D5 < 1$, $0 \leq T5 < 1$, $0 \leq T6 < 1$, $0 \leq Q2 < 1$, and $M2+D4+D5+T5+T6+Q2=1$.

The second siloxane compound has silicon-bonded hydrogen (Si—H) at the terminal end and for example, at least two silicon-bonded hydrogen (Si—H) per a molecule on the average. The silicon-bonded hydrogen (Si—H) may react with an alkenyl group at the terminal end of the post-described third siloxane compound. In addition, the silicon-bonded hydrogen (Si—H) may react with an alkenyl group at the terminal end of the first siloxane compound, when the first siloxane compound includes the alkenyl group at the terminal end.

At least one of $R^{13}$ to $R^{20}$ in the above Chemical Formula 6 may include a substituted or unsubstituted C6 to C30 aryl group. Accordingly, optical properties may be secured by increasing a refractive index.

The second siloxane compound may be, for example, obtained through hydrolysis and condensation polymerization of a monomer represented by $R^{13}R^{14}R^{15}SiA^9$ with at least one selected from a monomer represented by $R^{16}R^{17}SiA^{30}A^{31}$, a monomer represented by $A^{32}A^{33}A^{34}R^{18}Si$—$Y^3$—$SiR^{19}A^{35}A^{36}A^{37}$, a monomer represented by $R^{20}SiA^{38}A^{39}A^{40}$, a monomer represented by $A^{41}A^{42}A^{43}Si$—$Y^4$—$SiA^{44}A^{45}A^{46}$, and a monomer represented by $SiA^{47}A^{48}A^{49}A^{50}$. Herein, $R^{13}$ to $R^{20}$ are the same as defined above, and $A^{29}$ to $A^{50}$ are independently a C1 to C6 alkoxy group, a hydroxy group, a halogen, a carboxyl group, or a combination thereof.

The second siloxane compound may be used as one or a mixture of two or more.

The third siloxane compound may be, for example, represented by the following Chemical Formula 7.

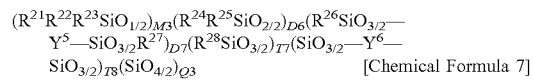

[Chemical Formula 7]

In the above Chemical Formula 7, $R^{21}$ to $R^{28}$ are independently substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{21}$ to $R^{28}$ is a substituted or unsubstituted C2 to C30 alkenyl group, $Y^5$ and $Y^6$ are independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0 \leq M3 < 1$, $0 \leq D6 < 1$, $0 \leq D7 < 1$, $0 \leq T7 < 1$, $0 \leq T8 < 1$, $0 \leq Q3 < 1$, and $M3+D6+D7+T7+T8+Q3=1$.

The third siloxane compound has a silicon-bonded alkenyl group (Si-Vi) at the terminal end and may have, for example, at least two silicon-bonded alkenyl groups (Si-Vi) per a molecule on the average. The silicon-bonded alkenyl groups (Si-Vi) may react with hydrogen at the terminal end of the second siloxane compound. In addition, the silicon-bonded alkenyl groups (Si-Vi) may react with hydrogen at the terminal end of the first siloxane compound when the first siloxane compound includes hydrogen at the terminal end.

At least one of $R^{21}$ to $R^{28}$ in the above Chemical Formula 7 may include a substituted or unsubstituted C6 to C30 aryl group. Accordingly, optical properties may be secured by increasing a refractive index.

The third siloxane compound may be, for example, obtained through hydrolysis and condensation polymerization of a monomer represented by $R^{21}R^{22}R^{23}SiA^{51}$ with at least one selected from a monomer represented by $R^{24}R^{25}SiA^{52}A^{53}$, a monomer represented by $A^{54}A^{55}R^{26}Si$—$Y^5$—$SiR^{27}A^{57}A^{58}A^{59}$, a monomer represented by $R^{28}SiA^{60}A^{61}A^{62}$, a monomer represented by $R^{28}SiA^{60}A^{61}A^{62}$, a monomer represented by $A^{63}A^{64}A^{65}Si$—$Y^6$-$SiA^{66}A^{67}A^{68}$, and a monomer represented by $SiA^{69}A^{70}A^{71}A^{72}$. Herein, $R^{21}$ to $R^{28}$ are the same as defined above, and $A^{51}$ to $A^{72}$ may be independently a C1 to C6 alkoxy group, a hydroxy group, a halogen, a carboxyl group, or a combination thereof.

The third siloxane compound may be used as one or a mixture of two or more.

The second and third siloxane compounds may respectively have a weight average molecular weight ranging from about 100 to 1,000,000, specifically, about 100 to 100,000, and more specifically, about 100 to 50,000.

The second siloxane compound may be included in an amount of less than about 50 parts by weight, for example about 1 to 35 parts by weight based on 100 parts by weight of the second siloxane compound and the third siloxane compound.

The third siloxane compound may be included in an amount of greater than about 50 parts by weight, for example about 65 to 99 parts by weight based on 100 parts by weight of the second siloxane compound and the third siloxane compound.

The composition may further include a filler.

The filler may be made of, for example inorganic oxide, for more specific example zirconia, silica, alumina, titanium oxide, zinc oxide, or a combination thereof.

The composition may further include a hydrosilylation catalyst. The hydrosilylation catalyst may promote hydrosilylation reaction of the second siloxane compound and the third siloxane compound, and may include, for example platinum, rhodium, palladium, ruthenium, iridium or a combination thereof. The hydrosilylation catalyst may be included in an amount of about 0.1 ppm to 1000 ppm based on the total amount of the encapsulant composition.

The composition is heat-treated and cured at a predetermined temperature and thus, may be used as an encapsulant. The encapsulant may be applied to, for example, an optical device such as a light emitting diode and an organic light emitting diode device.

Hereinafter, a light emitting diode as one example of an optical device manufactured by applying an encapsulant according to one embodiment is illustrated referring to FIG. 1.

FIG. 1 is a schematic cross-sectional view showing a light emitting diode according to one embodiment.

Referring to FIG. 1, the light emitting diode includes a mold 110; a lead frame 120 disposed inside the mold 110; a light emitting diode chip 140 mounted on the lead frame 120; a bonding wire 150 connecting the lead frame 120 to the light emitting diode chip 140; and an encapsulant 200 covering the light emitting diode chip 140.

The encapsulant 200 is obtained by curing the above composition. The encapsulant 200 is formed from the above composition and thus, may improve adherence of the mold 110 to the lead frame 120 and the light emitting diode chip 140 and thus, decrease excitation or peeling-off.

A phosphor 190 may be dispersed in the encapsulant 200. The phosphor 190 includes a material excited by light and emitting light within its intrinsic wavelength range and largely includes a quantum dot such as a semiconductor nanocrystal. The phosphor 190 may include, for example, a mixture of two or more selected from blue phosphor, green phosphor, or red phosphor.

The phosphor 190 may display a color in a predetermined wavelength region by light supplied from the light emitting diode chip 140 as a light emission part, and herein, the light emitting diode chip 140 may display a color in a shorter wavelength region than the color displayed by the phosphor 190. For example, when the phosphor 190 displays red, the light emitting diode chip 140 may display blue or green having a shorter wavelength region than the red.

In addition, the color emitted from the light emitting diode chip 140 may be combined with the color emitted from the phosphor 190 and thus, display white. For example, when the light emitting diode chip 140 supplies blue light while the phosphor 190 includes a red phosphor and a green phosphor, the electronic device may combine blue, red, and green and display white.

The phosphor 190 may be omitted.

Mode for Invention

Hereinafter, the present disclosure is illustrated in more detail with reference to examples. However, these examples are exemplary, and the present disclosure is not limited thereto.

Synthesis of First Siloxane Compound

Synthesis Example 1

100 g of DMS-H21 (Gelest Inc.) and 35 g of PKA-5005 (NOF Corp.) were put in a 3-necked flask and agitated at 50° C., and 50 ppm of a Pt catalyst was added thereto in a dropwise fashion. When the addition was complete, the mixture was heated for 6 hours and cooled down to room temperature, and the Pt catalyst and a low molecular were removed therefrom through column, obtaining a compound having an average composition formula represented by the following Chemical Formula 8. Molecular weight of the first siloxane compound measured with gel permeation chromatography (GPC) and reduced to a polystyrene standard sample was 6,000, and structure of its Chemical Formula is analyzed by using H-NMR, Si-NMR, and an element analyzer.

[Chemical Formula 8]

Synthesis Example 2

A compound having an average composition represented by the following Chemical Formula 9 was manufactured according to the same method as Synthesis Example 1 except for using 47 g of PKA-5013 (NOF Corp.) instead of 35 g of the PKA-5005 (NOF Inc.). Molecular weight of the compound reduced to polystyrene was 6,500, and structure of its Chemical Formula was identified by using H-NMR, Si-NMR, and an element analyzer.

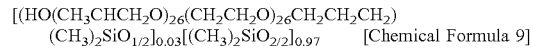

[Chemical Formula 9]

Synthesis Example 3

First Step 1 kg of a solvent obtained by mixing water and toluene in a weight ratio of 5:5 was put in a 3-necked flask and maintained at 23° C., and a mixture of trimethoxysilane and an ethyleneoxide/propyleneoxide-containing monomer represented by the following Chemical Formula A in a mole ratio of 1:2 and a Pt catalyst were added thereto.

[Chemical Formula A]

When the addition was complete, the mixture was heated at 60° C. for one hour to perform a hydrosilylation reaction. Subsequently, the reactant was cooled down to room temperature, and an aqueous layer was removed therefrom, obtaining a monomolecule solution dissolved in toluene. Then, the catalyst in the monomolecule solution was removed through column. Then, the monomolecule solution was distillated under a reduced pressure to remove the toluene, obtaining a compound represented by the following Chemical Formula 10.

$$CH_3(CH_3CHCH_2O)_y(CH_2CH_2O)_xCH_2CH_2CH_2SiO_{3/2}$$
(a ratio of x and y is 2:8) [Chemical Formula 10]

Second Step 1 kg of a mixed solvent obtained by mixing water and toluene in a weight ratio of 5:5 was put in a 3-necked flask and maintained at 65° C., and 1 kg of mixture of a compound represented by the above Chemical Formula 10, phenyltrichlorosilane, and vinyltrichlorosilane in a mole ratio of 30:30:40 along with a catalyst of KOH was added thereto. When the addition was complete, a condensation polymerization reaction was performed while the mixture was heated at 75° C. for 5 hours. Subsequently, the reactant was cooled down to room temperature, and an aqueous layer was removed therefrom, manufacturing a polymer solution dissolved in toluene. Then, the polymer solution was washed with water to remove the catalyst. Then, the polymer solution was distilled under a reduced pressure to remove the toluene therefrom, obtaining a compound represented by the following Chemical Formula 11.

$$(CH_3(CH_3CHCH_2O)_y(CH_2CH_2O)_xCH_2CH_2CH_2SiO_{3/2})_{0.3}(PhSiO_{3/2})_{0.3}(ViSiO_{3/2})_{0.4}$$ [Chemical Formula 11]

(a ratio of x and y is 2:8, Ph: phenyl group, and Vi: vinyl group)

Synthesis Example 4

A compound represented by the following Chemical Formula 12 was synthesized according to the same method as Synthesis Example 3 except for using a compound represented by the above Chemical Formula 10, phenyltrichlorosilane, and vinyltrichlorosilane in a mole ratio of 40:20:40.

$$(CH_3(CH_3CHCH_2)(CH_2CH_2O)_xCH_2CH_2CH_2SiO_3)_{0.4}(PhSiO_{3/2})_{0.2}(ViSiO_3)_{0.4}$$ [Chemical Formula 12]

(a ratio of x and y is 2:8, Ph: phenyl group, and Vi: vinyl group)

Synthesis Example 5

A compound represented by the following Chemical Formula 13 was synthesized according to the same method as Synthesis Example 3 except for using a monomer of ethyleneoxide/propyleneoxide in a ratio, that is, x and y of 8:2.

$$(CH_3(CH_3CHCH_2O)_y(CH_2CH_2O)_xCH_2CH_2CH_2SiO_{3/2})_{0.3}(PhSiO_{3/2})_{0.3}(ViSiO_{3/2})_{0.4}$$ [Chemical Formula 13]

(a ratio of x and y is 8:2, Ph: phenyl group, and Vi: vinyl group)

Synthesis Example 6

A compound represented by the following Chemical Formula 14 was synthesized according to the same method as Synthesis Example 3 except for using a monomer of ethyleneoxide/propyleneoxide in a ratio of 8:2, that is, a ration between x and y and also, a compound represented by the above Chemical Formula 10, phenyltrichlorosilane, and vinyltrichlorosilane in a mole ratio of 40:20:40.

$$(CH_3(CH_3CHCH_2O)_y(CH_2CH_2O)_xCH_2CH_2CH_2SiO_{3/2})_{0.4}(PhSiO_{3/2})_{0.2}(ViSiO_{3/2})_{0.4}$$ [Chemical Formula 14]

(a ratio of x and y is 8:2, Ph: phenyl group, and Vi: vinyl group)

Synthesis of Second Siloxane Compound

Synthesis Example 7

1 kg of a mixed solvent obtained by mixing water and toluene in a weight ratio of 5:5 was put in a 3-necked flask and maintained at 23° C., and a mixture of dimethylchlorosilane and diphenyldichlorosilane in a mole ratio of 10:90 was added thereto in a dropwise fashion for 2 hours. When the addition was complete, the mixture was heated at 90° C. for 3 hours to perform a condensation polymerization reaction. Subsequently, the reactant was cooled down to room temperature, and an aqueous layer was removed therefrom to prepare a siloxane solution dissolved in toluene. Then, the siloxane solution was washed with water to remove a reactant, hydrochloric acid. Then, the neutral siloxane solution was distilled under a reduced pressure to remove the toluene, obtaining an H-terminal end siloxane compound represented by the following Chemical Formula 6a.

$$(Me_2HSiO_{1/2})_{0.1}(Ph_2SiO_{2/2})_{0.9}$$ [Chemical Formula 6a]

(Me: methyl group, H: hydrogen, and Ph: phenyl group)

Synthesis of Third Siloxane Compound

Synthesis Example 8

1 kg of a mixed solvent of water and toluene in a weight ratio of 5:5 was put in a 3-necked flask and maintained at 23° C., and a mixture of vinyldimethylchlorosilane and phenyltrichlorosilane in a mole ratio of 10:90 was added thereto for 2 hours. When the addition was complete, the mixture was heated at 90° C. for 3 hours to perform a condensation polymerization reaction. Subsequently, the reactant was cooled down to room temperature, and an aqueous layer was removed therefrom, preparing a siloxane solution dissolved in toluene. Then, the siloxane solution was washed with water to remove a byproduct, chlorine. Then, the neutral siloxane solution was distilled under a reduced pressure to remove the toluene, obtaining a Vi-terminal end siloxane compound represented by the following Chemical Formula 7a.

$$(Me_2ViSiO_{1/2})_{0.1}(PhSiO_{3/2})_{0.9}$$ [Chemical Formula 7a]

(Me: methyl group, Vi: vinyl group, and Ph: phenyl group)

Preparation of Composition

Example 1

0.1 wt % of the first siloxane compound according to Synthesis Example 1, 25 wt % of the second siloxane compound according to Synthesis Example 7, 74.9 wt % of the third siloxane compound according to Synthesis Example 8, and a hydrosilylation catalyst, Pt-CS 2.0 (Umicore) (added in 5 ppm of a Pt amount) were mixed and foam-removed under vacuum, manufacturing a curable polysiloxane composition for an optical device.

Example 2

A curable polysiloxane composition for an optical device was manufactured by mixing 0.5 wt % of the first siloxane compound according to Synthesis Example 1, 25 wt % of the second siloxane compound according to Synthesis Example 7, 74.5 wt % of the third siloxane compound according to Synthesis Example 8, and a hydrosilylation catalyst, Pt-CS 2.0 (Umicore) (5 ppm of a Pt amount) by removing a foam from the mixture under vacuum.

Example 3

A curable polysiloxane composition for an optical device was parepared by mixing 1.0 wt % of the first siloxane compound according to Synthesis Example 1, 25 wt % of the second siloxane compound according to Synthesis Example 7, 74.0 wt % of the third siloxane compound according to Synthesis Example 8, and a hydrosilylation catalyst, Pt-CS 2.0 (Umicore) (5 ppm of a Pt amount) and removing a foam from the mixture under vacuum.

Example 4

A curable polysiloxane composition for an optical device was manufactured by mixing 0.1 wt % of the first siloxane compound according to Synthesis Example 2, 25 wt % of the second siloxane compound according to Synthesis Example 7, 74.9 wt % of third siloxane compound according to Synthesis Example 8, and a hydrosilylation catalyst, Pt-CS 2.0 (Umicore (5 ppm of a Pt amount) and removing a foam from the mixture under vacuum.

Example 5

A curable polysiloxane composition for an optical device was manufactured by using 0.5 wt % of the first siloxane compound according to Synthesis Example 2, 25 wt % of the second siloxane compound according to Synthesis Example 7, 74.5 wt % of the third siloxane compound according to Synthesis Example 8, and a hydrosilylation catalyst, Pt-CS 2.0 (Umicore) (5 ppm of a Pt amount) and removing a foam from the mixture under vacuum.

Example 6

A curable polysiloxane composition for an optical device was manufactured by using 1.0 wt % of the first siloxane compound according to Synthesis Example 2, 25 wt % of the second siloxane compound according to Synthesis Example 7, 74.0 wt % of the third siloxane compound according to Synthesis Example 8, and a hydrosilylation catalyst, Pt-CS 2.0 (Umicore) (5 ppm of a Pt amount) and removing a foam from the mixture under vacuum.

Example 7

A curable polysiloxane composition for an optical device was manufactured by mixing 1.0 wt % of the first siloxane compound according to Synthesis Example 3, 25 wt % of the second siloxane compound according to Synthesis Example 7, 74.0 wt % of the third siloxane compound according to Synthesis Example 8, and a hydrosilylation catalyst, Pt-CS 2.0 (Umicore) (5 ppm of a Pt amount) and removing a foam from the mixture under vacuum.

Example 8

A curable polysiloxane composition for an optical device was manufactured by using 1.0 wt % of the first siloxane compound according to Synthesis Example 4, 25 wt % of the second siloxane compound according to Synthesis Example 7, 74.0 wt % of the third siloxane compound according to Synthesis Example 8, and a hydrosilylation catalyst, Pt-CS 2.0 (Umicore) (5 ppm of a Pt amount) and removing a foam from the mixture under vacuum.

Example 9

A curable polysiloxane composition for an optical device was manufactured by using 1.0 wt % of the first siloxane compound according to Synthesis Example 5, 25 wt % of the second siloxane compound according to Synthesis Example 7, 74.0 wt % of the third siloxane compound according to Synthesis Example 8, and a hydrosilylation catalyst, Pt-CS 2.0 (Umicore) (5 ppm of a Pt amount) and removing a foam from the mixture under vacuum.

Example 10

A curable polysiloxane composition for an optical device was manufactured by mixing 1.0 wt % of the first siloxane compound according to Synthesis Example 6, 25 wt % of the second siloxane compound according to Synthesis Example 7, 74.0 wt % of the third siloxane compound according to Synthesis Example 8, and a hydrosilylation catalyst, Pt-CS 2.0 (Umicore) (5 ppm of a Pt amount) and removing a foam from the mixture under vacuum.

Example 11

A curable polysiloxane composition for an optical device was manufactured by mixing 3.0 wt % of the first siloxane compound according to Synthesis Example 3, 25 wt % of the second siloxane compound according to Synthesis Example 7, 72.0 wt % of the third siloxane compound according to Synthesis Example 8, and a hydrosilylation catalyst, Pt-CS 2.0 (Umicore) (5 ppm of a Pt amount), and removing a foam from the mixture under vacuum.

Example 12

A curable polysiloxane composition for an optical device was manufactured by mixing 3.0 wt % of the first siloxane compound according to Synthesis Example 4, 25 wt % of the second siloxane compound according to Synthesis Example 7, 72.0 wt % of the third siloxane compound according to Synthesis Example 8, and a hydrosilylation catalyst, Pt-CS 2.0 (Umicore) (5 ppm of a Pt amount), and removing a foam from the mixture under vacuum.

Example 13

A curable polysiloxane composition for an optical device was manufactured by mixing 3.0 wt % of the first siloxane compound according to Synthesis Example 5, 25 wt % of the second siloxane compound according to Synthesis Example 7, 72.0 wt % of the third siloxane compound according to Synthesis Example 8, and a hydrosilylation catalyst, Pt-CS 2.0 (Umicore) (5 ppm of a Pt amount), and removing a foam from the mixture under vacuum.

Example 14

A curable polysiloxane composition for an optical device was manufactured by mixing 3.0 wt % of the first siloxane compound according to Synthesis Example 6, 25 wt % of the second siloxane compound according to Synthesis Example 7, 72.0 wt % of the third siloxane compound according to Synthesis Example 8, and a hydrosilylation catalyst, Pt-CS 2.0 (Umicore) (5 ppm of a Pt amount), and removing a foam from the mixture under vacuum.

Comparative Example 1

A curable polysiloxane composition for an optical device was manufactured by mixing 25 wt % of the second siloxane compound according to Synthesis Example 7, 75 wt % of the third siloxane compound according to Synthesis Example 8, and a hydrosilylation catalyst, Pt-CS 2.0 (Umicore) (5 ppm of a Pt amount), and removing a foam from the mixture under vacuum.

Evaluation

A refractive index, hardness, a degree of color scattering, and sulfur resistance of the curable polysiloxane compositions for an optical device according to Examples 1 to 14 and Comparative Example 1 were evaluated.

The refractive index of the compositions according to Examples 1 to 14 and Comparative Example 1 was measured by using an Abbe refractive index meter under a wavelength of D-line 589 nm.

The hardness was measured by respectively injecting the compositions according to Examples 1 to 14 and Comparative Example 1 in a mold (2 cm (width)×5 cm (length)×0.6 cm (thickness)) coated with TEFLON (tetrafluoroethylene), sequentially curing the compositions at 80° C. for 1 hour, at 120° C. for 1 hour, and at 160° C. for 1 hour, and cooling them down to room temperature and using a Shore A hardness meter.

The degree of color scattering was measured by respectively injecting the compositions according to Examples 1 to 14 and Comparative Example 1 into a LED package by using a dispensing equipment (Musashi, ML-808FXcom) and sequentially curing them at 80° C. for 1 hour, at 120° C. for 1 hour, and at 160° C. for 1 hour to obtain a package sample and then, using an integrating sphere (CAS 140 CT, Instrument Systems). The degree of color scattering of the compositions according to Examples 1 to 14 were evaluated referring the degree of color scattering of the composition of Comparative Example 1 to be 100%.

The sulfur resistance was evaluated by respectively injecting the compostions according to Examples 1 to 14 and Comparative Example 1 into a LED package with a dispensing equipment (ML-808FXcom, Musashi) and sequentially curing them at 80° C. for 1 hour, at 120° C. for 1 hour, and at 160° C. for 1 hour to obtain a package sample and then, measuring initial luminance with an integrating sphere (CAS 140 CT, Instrument Systems). Subsequently, the package sample was disposed in a 250 me glass bottle after 0.2 g of sulfur powder was put in the 250 mL glass bottle and then, allowed to stand in a 75° C. oven for 8 hours. Then, luminance of the package sample was measured by taking the package sample out of the glass bottle and calculating a difference between the luminance and initial luminance.

The results are provided in Table 1.

TABLE 1

| | Refractive index | Hardness (Shore A) | Degree of color scattering (%) | Sulfur resistance (%) |
|---|---|---|---|---|
| Example 1 | 1.530-1.540 | 90 | 90 | −21 |
| Example 2 | 1.530-1.540 | 90 | 81 | −17 |
| Example 3 | 1.530-1.540 | 90 | 67 | −11 |
| Example 4 | 1.530-1.540 | 90 | 87 | −18 |
| Example 5 | 1.530-1.540 | 90 | 75 | −13 |
| Example 6 | 1.530-1.540 | 90 | 59 | −9 |
| Example 7 | 1.530-1.540 | 90 | 55 | −13 |
| Example 8 | 1.530-1.540 | 90 | 53 | −12 |
| Example 9 | 1.530-1.540 | 90 | 64 | −15 |
| Example 10 | 1.530-1.540 | 90 | 60 | −14 |
| Example 11 | 1.530-1.540 | 90 | 45 | −7 |
| Example 12 | 1.530-1.540 | 90 | 43 | −6 |
| Example 13 | 1.530-1.540 | 90 | 54 | −12 |
| Example 14 | 1.530-1.540 | 90 | 52 | −11 |
| Comparative Example 1 | 1.530-1.540 | 90 | 100 | −24 |

Referring to Table 1, the compositions according to Examples 1 to 14 show similar refractive index and hardness to those of the composition according to Comparative Example 1 and also, improved degree of color scattering and sulfur resistance.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A curable polysiloxane composition for an optical device, comprising:
at least one first siloxane compound represented by the following Chemical Formula 1,
at least one second siloxane compound having a silicon-bonded hydrogen (Si—H) at a terminal end thereof, and
at least one third siloxane compound having a silicon-bonded alkenyl group (Si-Vi) at a terminal end thereof,
wherein the curable polysiloxane composition is light transmissive:

$(R^1R^2R^3SiO_{1/2})_{M1}(R^4R^5SiO_{2/2})_{D1}(R^6R^7SiO_{2/2})_{D2}$
$(R^8SiO_{2/2}-Y^1-SiO_{2/2}R^9)_{D3}(R^{10}SiO_{3/2})_{T1}$
$(R^{11}SiO_{3/2})_{T2}(R^{12}SiO_{3/2})_{T3}(SiO_{3/2}-Y^2-$
$SiO_{3/2})_{T4}(SiO_{4/2})_{Q1}$     [Chemical Formula 1]

wherein, in the above Chemical Formula 1,
$R^1$ to $R^{12}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, or a group represented by the following Chemical Formula 1a,
at least one of $R^1$ to $R^3$ and $R^{10}$ to $R^{12}$ is a group represented by the following Chemical Formula 1a,
when at least one of $R^1$ to $R^3$ is the following Chemical Formula 1a, the others of $R^1$ to $R^3$ are not a substituted or unsubstituted C2 to C30 alkenyl group,
$Y^1$ and $Y^2$ are each independently a single bond, a substituted or unsubstituted C1 to C30 alkylene group, a substituted or unsubstituted C3 to C30 cycloalkylene group, unsubstituted C1 to C30 heteroalkylene group, a substituted or unsubstituted C6 to C30 arylene group, a substituted or unsubstituted C3 to C30 heteroarylene group, or a combination thereof, $0 \le M1 < 1$, $0 \le D1 < 1$, $0 \le D2 < 1$, $0 \le D3 < 1$, $0 \le T1 < 1$, $0 \le T2 < 1$, $0 \le T3 < 1$, $0 \le T4 < 1$ and $0 \le Q1 < 1$, and $M1+D1+D2+D3+T1+T2+T3+T4+Q1=1$, $$*\text{-}L^1\text{-}(O\text{-}L^2)_x\text{-}(O\text{-}L^3)_y\text{-}Z \quad \text{[Chemical Formula 1a]}$$

wherein, in the above Chemical Formula 1a, $L^1$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, $L^2$ and $L^3$ are each independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, Z is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $0 \le x \le 200$ and $0 \le y \le 200$, x and y are not simultaneously 0, and

* is a point where silicon (Si) of Chemical Formula 1 is linked, wherein the group represented by the above Chemical Formula 1a is a group represented by the following Chemical Formula 1aa:

$$*\text{-}L^1\text{-}(OC_2H_4)_x\text{—}(OC_3H_6)_y\text{-}Z \quad \text{[Chemical Formula 1aa]}$$

wherein, in the above Chemical Formula 1aa, $L^1$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, Z is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $0 \le x \le 200$ and $0 \le y \le 200$, x and y are not simultaneously 0, and

* is a point where silicon (Si) of Chemical Formula 1 is linked, and wherein the first siloxane compound is represented by the following Chemical Formula 5:

$$(R^1R^2R^3SiO_{1/2})_{M1}(R^{10}SiO_{3/2})_{T1}(R^{11}SiO_{3/2})_{T2}(R^{12}SiO_{3/2})_{T3}(SiO_{3/2}\text{—}Y^2\text{—}SiO_{3/2})_{T4} \quad \text{[Chemical Formula 5]}$$

wherein, in the above Chemical Formula 5, $R^1$ to $R^3$, $R^{11}$ and $R^{12}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $R^{10}$ is a group represented by the above Chemical Formula 1aa, $Y^2$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, $0 \le M1 < 1$, $0 \le T1 < 1$, $0 \le T2 < 1$, $0 \le T3 < 1$ and $0 \le T4 < 1$, and $M1+T1+T2+T3+T4=1$.

2. The curable polysiloxane composition for an optical device of claim 1, wherein at least one of $R^1$ to $R^{12}$ and Z is hydrogen or a substituted or unsubstituted C2 to C30 alkenyl group.

3. The curable polysiloxane composition for an optical device of claim 1, wherein the second siloxane compound is represented by the following Chemical Formula 6:

$$(R^{13}R^{14}R^{15}SiO_{1/2})_{M2}(R^{16}R^{17}SiO_{2/2})_{D4}(R^{18}SiO_{3/2}\text{—}Y^3\text{—}SiO_{3/2}R^{19})_{D5}(R^{20}SiO_{3/2})_{T5}(SiO_{3/2}\text{—}Y^4\text{—}SiO_{3/2})_{T6}(SiO_{4/2})_{Q2} \quad \text{[Chemical Formula 6]}$$

wherein, in the above Chemical Formula 6, $R^{13}$ to $R^{20}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{13}$ to $R^{20}$ is hydrogen, $Y^3$ and $Y^4$ are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C3 to C20 heteroarylene group, a substituted or unsubstituted C2 to C20 alkenylene group, a substituted or unsubstituted C2 to C20 alkynylene group, or a combination thereof, 0≤M2<1, 0≤D4<1, 0≤D5<1, 0≤T5<1, 0≤T6<1, 0≤Q2<1, and

M2+D4+D5+T5+T6+Q2=1.

4. The curable polysiloxane composition for an optical device of claim 1, wherein the third siloxane compound is represented by the following Chemical Formula 7:

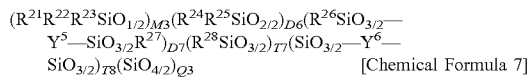

[Chemical Formula 7]

wherein, in the above Chemical Formula 7, $R^{21}$ to $R^{28}$ are each independently substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{21}$ to $R^{28}$ is a substituted or unsubstituted C2 to C30 alkenyl group, $Y^5$ and $Y^6$ are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, 0≤M3<1, 0≤D6<1, 0≤D7<1, 0≤T7<1, 0≤T8<1, 0≤Q3<1, and

M3+D6+D7+T7+T8+Q3=1.

5. The curable polysiloxane composition for an optical device of claim 1, wherein:

the second siloxane compound is included in an amount of less than 50 parts by weight, based on 100 parts by weight of the second siloxane compound and the third siloxane compound, and the third siloxane compound is included in an amount of greater than 50 parts by weight, based on 100 parts by weight of the second siloxane compound and the third siloxane compound.

6. The curable polysiloxane composition for an optical device of claim 1, wherein the first siloxane compound is included in an amount of 0.01 to 20 wt %, based on a total weight of the composition.

7. An encapsulant obtained by curing the curable polysiloxane composition for an optical device of claim 1.

8. An optical device comprising the encapsulant of claim 7.

9. An optical device comprising an encapsulant obtained by curing a curable polysiloxane composition for an optical device, the curable polysiloxane for an optical device comprising:

at least one first siloxane compound represented by the following Chemical Formula 1, at least one second siloxane compound having a silicon-bonded hydrogen (Si—H) at a terminal end thereof, and at least one third siloxane compound having a silicon-bonded alkenyl group (Si-Vi) at a terminal end thereof, wherein the curable polysiloxane composition is light transmissive:

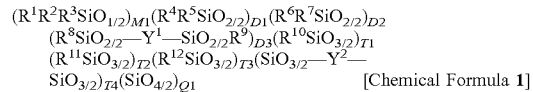

[Chemical Formula 1]

wherein, in the above Chemical Formula 1, $R^1$ to $R^{12}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, or a group represented by the following Chemical Formula 1a, at least one of $R^1$ to $R^3$ and $R^{10}$ to $R^{12}$ is a group represented by the following Chemical Formula 1a, when at least one of $R^1$ to $R^3$ is the following Chemical Formula 1a, the others of $R^1$ to $R^3$ are not a substituted or unsubstituted C2 to C30 alkenyl group, $Y^1$ and $Y^2$ are each independently a single bond, a substituted or unsubstituted C1 to C30 alkylene group, a substituted or unsubstituted C3 to C30 cycloalkylene group, unsubstituted C1 to C30 heteroalkylene group, a substituted or unsubstituted C6 to C30 arylene group, a substituted or unsubstituted C3 to C30 heteroarylene group, or a combination thereof, 0≤M1<1, 0≤D1<1, 0≤D2<1, 0≤D3<1, 0≤T1<1, 0≤T2<1, 0≤T3<1, 0≤T4<1 and 0≤Q1<1, and

M1+D1+D2+D3+T1+T2+T3+T4+Q1=1,

[Chemical Formula 1a]

wherein, in the above Chemical Formula 1a, $L^1$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, $L^2$ and $L^3$ are each independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C1 to C30 heteroalkylene group, or a combination thereof, Z is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, $0 \leq x \leq 200$ and $0 \leq y \leq 200$, x and y are not simultaneously 0, and

* is a point where silicon (Si) of Chemical Formula 1 is linked.

* * * * *